(12) United States Patent
Chen et al.

(10) Patent No.: US 11,875,045 B2
(45) Date of Patent: Jan. 16, 2024

(54) SEMICONDUCTOR MEMORY AND METHOD FOR DENSITY CONFIGURING OF BANK OF SEMICONDUCTOR MEMORY

(71) Applicant: CHANGXIN MEMORY TECHNOLOGIES, INC., Hefei (CN)

(72) Inventors: Jixing Chen, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/844,205

(22) Filed: Jun. 20, 2022

(65) Prior Publication Data
US 2023/0012916 A1 Jan. 19, 2023

Related U.S. Application Data

(63) Continuation of application No. PCT/CN2021/128174, filed on Nov. 2, 2021.

(30) Foreign Application Priority Data

Jul. 2, 2021 (CN) .......................... 202110783912.0

(51) Int. Cl.
G06F 3/06 (2006.01)
(52) U.S. Cl.
CPC .......... *G06F 3/0626* (2013.01); *G06F 3/0644* (2013.01); *G06F 3/0673* (2013.01)
(58) Field of Classification Search
CPC ..... G06F 3/0626; G06F 3/0644; G06F 3/0673
See application file for complete search history.

(56) References Cited

U.S. PATENT DOCUMENTS

| 9,158,681 B1 | 10/2015 | Samuels |
| 9,563,362 B2 | 2/2017 | Samuels |
(Continued)

FOREIGN PATENT DOCUMENTS

| CN | 1763863 A | 4/2006 |
| CN | 104679592 A | 6/2015 |
(Continued)

OTHER PUBLICATIONS

Partial Supplementary European Search Report in the European application No. 21927042.8, dated Sep. 13, 2023, 16 pages.
(Continued)

*Primary Examiner* — Jae U Yu
(74) *Attorney, Agent, or Firm* — Cooper Legal Group, LLC

(57) ABSTRACT

A semiconductor memory and a method for density configuration of a bank of the semiconductor memory are provided. The method includes: determining a target bank to be configured of the semiconductor memory; determining a density configuration parameter of the target bank, the density configuration parameter being configured to represent a density to be configured for the target bank; determining a target code from a set of codes of the target bank based on the density configuration parameter of the target bank, the target code corresponding to a storage region to be trimmed in the target bank; generating, based on the target code, a region selection signal configured to select the storage region to be trimmed in the target bank; and trimming the storage region to be trimmed based on the region selection signal to configure the density of the target bank.

18 Claims, 14 Drawing Sheets

(56) References Cited

U.S. PATENT DOCUMENTS

| | | |
|---|---|---|
| 10,073,622 B2 | 9/2018 | Kim |
| 11,042,328 B2 | 6/2021 | Choi |
| 11,048,662 B2 | 6/2021 | Kim |
| 2003/0028710 A1* | 2/2003 | Shinohara .............. G11C 29/80 711/159 |
| 2014/0149648 A1 | 5/2014 | Roohparvar |
| 2017/0083401 A1 | 3/2017 | Ryu |
| 2018/0121097 A1 | 5/2018 | Kim |
| 2018/0129674 A1 | 5/2018 | Kim et al. |
| 2019/0278498 A1 | 9/2019 | Dedrick |
| 2020/0192738 A1 | 6/2020 | Sarkar |
| 2021/0165735 A1 | 6/2021 | Chung |
| 2021/0173731 A1 | 6/2021 | Sarkar |
| 2021/0240667 A1 | 8/2021 | Kim et al. |
| 2022/0004327 A1 | 1/2022 | Dedrick |
| 2023/0024176 A1 | 1/2023 | Sarkar |

FOREIGN PATENT DOCUMENTS

| | | |
|---|---|---|
| CN | 107003939 A | 8/2017 |
| CN | 108022611 A | 5/2018 |
| CN | 108073358 A | 5/2018 |
| CN | 110007858 A | 7/2019 |
| CN | 112306408 A | 2/2021 |
| EP | 3189437 B1 | 7/2017 |
| TW | I430090 B | 3/2014 |
| WO | 2011048738 A1 | 4/2011 |

OTHER PUBLICATIONS

Authorization Patent of the Taiwanese application No. 111122691, dated Nov. 11, 2023, 35 pages with English translation.

* cited by examiner

SEMICONDUCTOR MEMORY AND METHOD FOR DENSITY CONFIGURING OF BANK OF SEMICONDUCTOR MEMORY

CROSS-REFERENCE TO RELATED APPLICATION

This application is a continuation of PCT International Application No. PCT/CN2021/128174, filed on Nov. 2, 2021, which is based on and claims priority to Chinese patent application No. 202110783912.0, filed on Jul. 12, 2021 and entitled "SEMICONDUCTOR MEMORY AND METHOD FOR CONFIGURING DENSITY OF BANK OF SEMICONDUCTOR MEMORY". The contents of PCT International Application No. PCT/CN2021/128174 and Chinese patent application No. 202110783912.0 are hereby incorporated by reference in their entireties.

BACKGROUND

At present, in order to achieve different densities for the same type of chips, a set of trim commands may be adopted to trim same storage regions (arrays) of all the banks of each full-chip to obtain different densities.

Since the damaged arrays of different banks may be completely different, in order to utilize the chip whose arrays are partially damaged, the method of selecting the same arrays of the full-chip for trimming is obviously defective and results in the low effective utilization rate of the density configuration of the banks of the semiconductor memory.

SUMMARY

The embodiments of the disclosure relate to the field of semiconductor technologies, and provide a semiconductor memory and a method for density configuration of a bank of the semiconductor memory.

In a first aspect, an embodiment of the disclosure provides a method for density configuration of a bank of a semiconductor memory, including:

determining a target bank to be configured of the memory;

determining a density configuration parameter of the target bank, the density configuration parameter being configured to represent a density to be configured for the target bank;

determining, based on the density configuration parameter of the target bank, a target code from a set of codes of the target bank, the target code corresponding to a storage region to be trimmed in the target bank;

generating, based on the target code, a region selection signal configured to select the storage region to be trimmed in the target bank; and trimming, based on the region selection signal, the storage region to be trimmed to configure the density of the target bank.

In a second aspect, an embodiment of the disclosure provides a semiconductor memory, including:

a target bank, including at least two storage regions;

an address processing circuit, configured to output an address of the target bank, an output terminal of the address processing circuit being connected to the target bank;

a code acquisition circuit, configured to receive a target code, the target code corresponding to at least one storage region to be trimmed in the target bank;

a region selection signal generation circuit, configured to generate, based on the target code, a region selection signal configured to select the storage region to be trimmed in the target bank, an output terminal of the region selection signal generation circuit being connected to an input terminal of a trim circuit; and the trim circuit, configured to trim the storage region to be trimmed based on the region selection signal to configure the density of the target bank, an output terminal of the trim circuit being connected to the target bank.

BRIEF DESCRIPTION OF THE DRAWINGS

In the drawings (which are not necessarily drawn to scale), similar reference numerals may describe similar components in different views. Similar reference numerals with different letter suffixes may represent different examples of similar components. The drawings generally illustrate, by way of examples and not limitation, various embodiments of the disclosure.

DETAILED DESCRIPTION

To make the objectives, technical solutions and advantages of the embodiments of the disclosure be understood more clearly, the specific technical solutions of the disclosure will be described in further detail below with reference to the drawings in the embodiments of the disclosure. The following embodiments are merely used to illustrate the disclosure, but are not intended to limit the scope of the embodiments of the disclosure.

In the related art, due to the high cost of each set of masks for memory chips, the trims are usually adopted to achieve different densities in the design of the same type of chips so as to quickly dominate the market. In actual production, there will also be some chips whose arrays are partially damaged. In this case, these chips may be sold as low-density chips to increase the yield. For example, 8 Gb (Gigabit) chips may be used as 4 Gb/2 Gb chips. In order to achieve different densities for the same type of chips, a set of trims is generally adopted to select the same arrays of all the banks of the full-chip for trimming Such a method is relatively simple in design, but not flexible enough. In order to utilize these chips whose arrays are partially damaged, considering that damaged arrays of different banks may be completely different, the method of selecting the same arrays of all the banks of the full-chip for trimming is obviously defective.

It should be understood that the banks refer to physical memory banks in the DRAM or the bank refers to logic storage repositories in the DRAM. A chip may include multiple banks, for example, the chip may include 8 banks. Each bank may include multiple arrays, and the number of the arrays in each bank represents the data bit-width of the chip. Each array includes multiple memory cells.

Figure 1:
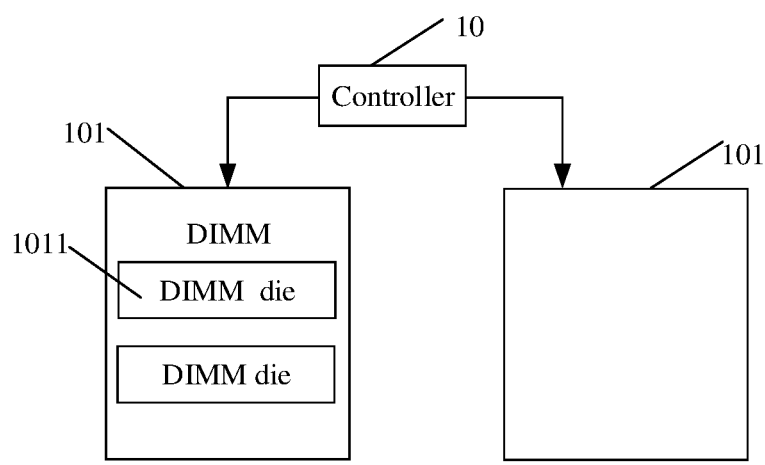
FIG. 1 is a diagram of composition structure of a Dynamic Random Access Memory (DRAM) in the related art.

In a possible implementation, a semiconductor memory may be a DRAM. FIG. 1 is a diagram of composition structural of a DRAM in the related art. As shown in FIG. 1, a controller 10 is configured to control two DIMMs (Dual-Inline-Memory-Modules) 101, and each DIMM 101 includes at least two DIMM dies 1011.

Figure 2:
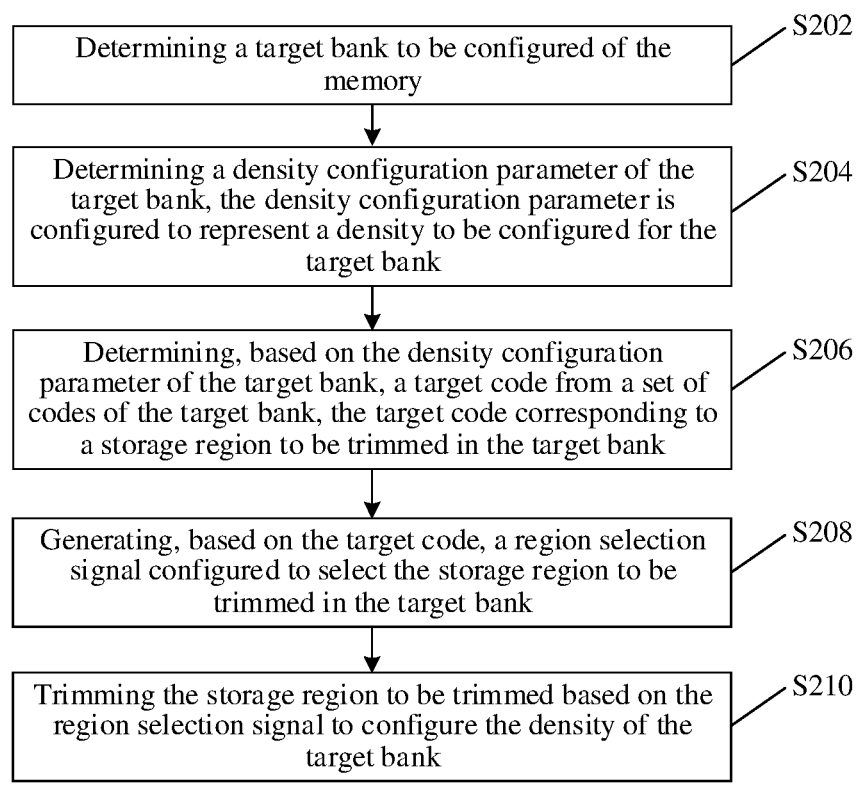
FIG. 2 is a flowchart of implementation of a method for density configuration of a bank of a semiconductor memory according to an embodiment of the disclosure.

In view of the foregoing technical problems, an embodiment of the disclosure provides a method for density configuration of a bank of a semiconductor memory. As shown in FIG. 2, the method includes the operation S202 to S210 including:

In S202, determining a target bank to be configured of the memory.

It should be understood that the memory may be a DRAM of the megabit-level monolithic storage density or may be another semiconductor memory which supports the trim function; and the target bank may be any bank to be configured of the memory. In an example, a bank may be an implementation of a memory block. Taking a chip including 16 banks as an example, when the 16 banks are Bank0 to Bank15 respectively, the target bank may be any one of the Bank0 to Bank15. For example, the target bank may be Bank8 or Bank0.

In some possible implementations, determining the target bank to be configured of the memory may include: determining each bank of the memory as the target bank to be configured, when each bank of the memory is required to be configured.

According to some embodiments, a density of the target bank is determined according to a density of the memory chip. For example, for a 16 Gb chip including 16 banks, the density of each bank is 1 Gb, i.e., the density of the target bank is 1 Gb.

In S204, determining a density configuration parameter of the target bank, the density configuration parameter being configured to represent a density to be configured for the target bank.

In some possible implementations, the density configuration parameter of the target bank may include at least one of: a target density of the target bank, a storage region to be trimmed in the target bank, or an available storage region in the target bank.

It should be understood that a storage region may be an implementation of an array, and the storage region may be represented by "Region", for example, each bank may be divided into 6 regions, e.g., Region<5:0> including Region<0> to Region<5>, where Region<5> may be one of the storage regions.

In an example, the density of the target bank Bank8 without being damaged or trimmed may be 1 Gb, and the target density of Bank8 may be less than or equal to 1 Gb, for example, the target density may be (⅛) Gb, (¼) Gb, (½) Gb, (⅔) Gb, or the like. Therefore, there are two situations as follows.

First situation: Bank8 includes 6 regions, e.g., Region<5:0>, and Bank8 is not damaged. When the density of 1 Gb is required to be changed into the target density of (⅔) Gb to meet the demands, any storage region in Region<3:2>, Region<1:0> and Region<5:4> in Region<5:0> may be determined as the storage region to be trimmed in the target bank Bank8. Since Bank8 is not damaged, all the storage regions may be taken as the available storage region in the target bank.

It can be seen that when the target bank is not damaged, only the target density of the target bank is required to be determined, and there are three methods for implementing the density configuration.

Second situation: Bank8 includes 6 regions, e.g., Region<5:0>, and Region<1:0> is damaged. When the density of 1 Gb is required to be changed into the target density of (⅔) Gb to meet the demands, Region<1:0> in Region<5:0> may be determined as the storage region to be trimmed in the target bank Bank8, and the remaining Region<5:2> is taken as the available storage region in the target bank. When the density of 1 Gb is required to be changed into the target density of (⅓) Gb, the available storage region in the target bank may be Region<3:2>, and Region<1:0> and Region<5:4> may be determined as the storage region to be trimmed in the target bank Bank8.

It can be seen that when the target bank is damaged, the corresponding remaining region may be taken as the available storage region in the target bank, and the storage region including the damaged region is required to be determined as the storage region to be trimmed according to the determined target density of the target bank.

Determining the density configuration parameter of the target bank may include: determining the density configuration parameter of the target bank according to the damage information of the target bank and the density configuration requirement of the target bank.

In S206, determining, based on the density configuration parameter of the target bank, a target code from a set of codes of the target bank, the target code corresponding to a storage region to be trimmed in the target bank.

It should be understood that the set of codes of the target bank may be the codes representing different storage regions to be trimmed among the storage regions of the target bank. For example, each code among the set of codes of the target bank may be represented by trim_halfGoodBnk<1:0> or Density<1:0>, where trim_halfGoodBnk<1:0> or Density<1:0> may be 00, 01, 10, or 11. For example, trim_halfGoodBnk<1:0>=00 may represent that there is no storage region to be trimmed in Region<5:0> of the target bank Bank8; trim_halfGoodBnk<1:0>=01 may represent that the storage region to be trimmed in Region<5:0> of the target bank Bank8 is Region<5:4>; trim_halfGoodBnk<1:0>=10 may represent that the storage region to be trimmed in Region<5:0> of the target bank Bank8 is Region<3:2>; and trim_halfGoodBnk<1:0>=11 may represent that the storage region to be trimmed in Region<5:0> of the target bank Bank8 is Region<1:0>.

In an example, the target code is determined according to the storage region to be trimmed in the target bank, for example, the target code may be 10 when the storage region to be trimmed is Region<3:2>.

In a possible implementation, determining, based on the density configuration parameter of the target bank, the target code from the set of codes of a target bank may include: determining the target code corresponding to any storage region to be trimmed corresponding to the target density from the set of codes of the target bank according to the target density of the target bank, when the target bank is determined to be not damaged.

For example, the density of the target bank Bank8 without being damaged may be 1 Gb, and Bank8 includes 6 regions, e.g., Region<5:0>. When the target density is (⅔) Gb, and trim_halfGoodBnk<1:0> or Density<1:0> may be 00, 01, 10, 11 which represent different storage regions to be trimmed, any code representing (⅔) Gb may be selected as the target code from the set of codes represented by rim_halfGoodBnk<1:0> or Density<1:0>, and therefore the target code may be any of 01, 10 or 11.

In another possible implementation, determining, based on the density configuration parameter of the target bank, the target code from the set of codes of a target bank may include: when the target bank is determined to be damaged, determining a storage region to be trimmed and an available storage region according to a damaged storage region and the target density, and determining the target code from the set of codes of the target bank according to the storage region to be trimmed and the available storage region. It should be understood that the determined target code is unique, when the sum of the target density and the density of the damaged storage region is equal to the density of the target bank without being damaged.

For example, the density of the target bank Bank8 without being damaged may be 1 Gb, and Bank8 includes 6 regions, e.g., Region<5:0>. When Region<5:4> is damaged, and when the target density is (⅔) Gb and trim_halfGoodBnk<1:0> or Density<1:0> may be 00, 01, 10, 11 which represent different storage regions to be trimmed, a code representing the storage region to be trimmed (i.e., Region<5:4>) may be selected, from the set of codes represented by trim_halfGoodBnk<1:0> or Density<1:0>, as the target code, and therefore the target code is unique, i.e., 01.

In S208, generating, based on the target code, a region selection signal configured to select the storage region to be trimmed in the target bank.

It should be understood that the region selection signal is a target output level obtained by performing logic operation on the target code.

In S210, trimming, based on the region selection signal, the storage region to be trimmed to configure the density of the target bank.

It should be understood that trimming the storage region may be performed by changing a logic level of the storage region. For example, the level of the storage region before trimming may be low, and after the level of the storage region is converted from low to high, the storage region can be trimmed.

In a possible implementation, trimming, based on the region selection signal, the storage region to be trimmed to configure the density of the target bank may include: determining, according to the region selection signal, to apply a high voltage (high level) to the storage region to be trimmed, and to apply a low voltage (low level) to at least one storage region, other than the storage region to be trimmed, in the target bank so as to change a logic level of the storage region to be trimmed to trim the storage region to be trimmed and configure the density of the target bank.

According to the embodiments of the disclosure, since the density configuration parameters of different target banks to be configured may be different, the target codes determined based on the different density configuration parameters may be different, and the region selection signals generated based on the different target codes may further be different. Therefore, different storage regions to be trimmed of different target banks to be configured can be trimmed through different region selection signals, so that the storage region to be trimmed can be flexibly selected, thereby improving the effective utilization rate of the density configuration of the banks of the semiconductor memory.

An embodiment of the disclosure further provides a method for density configuration of a bank of a semiconductor memory, which includes the operations 101 to 117 including:

In 101, determining a target bank to be configured of the memory.

In 103, determining a density configuration parameter of the target bank, the density configuration parameter being configured to represent a density to be configured for the target bank.

In 105, determining, when the density configuration parameter of the target bank includes a storage region to be trimmed in the target bank or an available storage region in the target bank, the storage region to be trimmed based on the storage region to be trimmed or the available storage region.

It should be understood that the available storage region may be at least one storage region in the target bank other than the storage region to be trimmed.

In some possible implementations, determining the storage region to be trimmed based on the storage region to be trimmed or the available storage region may include: determining a damaged region in the target bank, determining the available storage region based on the damaged region, and then determining the storage region to be trimmed.

In an example, the density of the target bank Bank8 may be 1 Gb, and Bank8 includes 6 regions, e.g., Region<5:0>. When the target density is (⅔) Gb and Region<5:4> is damaged, the storage region to be trimmed may be determined as Region<5:4>; when the target density is (⅓) Gb and Region<5:4> is damaged, the storage region to be trimmed may be determined as Region<5:2> or determined as Region<1:0> and Region<5:4>.

In 107, determining a target code from a set of codes of the target bank based on the storage region to be trimmed, each code among the set of codes of the target bank corresponding to at least one storage region to be trimmed in the target bank.

In a possible implementation, determining the target code from the set of codes of the target bank based on the storage region to be trimmed may include: determining a code corresponding to the storage region to be trimmed from the set of codes of the target bank according to the storage region to be trimmed, regardless of whether the target bank is damaged or not. For example, when the storage region to be trimmed is determined as Region<5:4>, a code 01 corresponding to Region<5:4> is determined as the target code.

In 109, determining, when the density configuration parameter of the target bank includes a target density of the target bank, multiple codes corresponding to the density configuration parameter of the target bank from a set of codes of the target bank.

It should be understood that the multiple codes corresponding to the density configuration parameter of the target bank may be determined from the set of codes of the target bank directly according to the target density of the target bank and the density of the target bank without being damaged, when the storage regions of the target bank are not damaged. For example, the density of the target bank Bank8 may be 1 Gb, and Bank8 includes 6 regions, e.g., Region<5: 0>. When the target density is (⅔) Gb and Bank8 is not damaged, the multiple codes corresponding to the target density of the target bank are determined as 01, 10 and 11 from the set of codes including 00, 01, 10 and 11.

In 111, randomly selecting a code as the target code from the multiple codes corresponding to the density configuration parameter of the target bank, the target code corresponding to a storage region to be trimmed in the target bank.

In a possible implementation, the densities of storage regions to be trimmed which correspond to the respective codes among the multiple codes corresponding to the density configuration parameter of the target bank are same, and the target bank is not damaged, therefore, any one of the multiple codes corresponding to the density configuration parameter of the target bank may be taken as the target code.

In 113, determining a row address of the storage region to be trimmed in the target bank based on the target code.

Herein, the row address of the storage region to be trimmed in the target bank may be a 16-bit row address, e.g., Ra<15:0>, and Ra<15>, Ra<14> and Ra<13> represent a high 3-bit address of the row address.

It should be understood that the storage region to be trimmed may be determined according to the target code, and the row address of the storage region to be trimmed may be determined according to the storage region to be trimmed.

In some possible implementations, row addresses corresponding to different storage regions to be trimmed in the target bank may be different. For example, the density of the target bank Bank8 is 1 Gb, and Bank8 includes 6 regions, e.g., Region<5:0>. Memory addresses corresponding to the storage regions to be trimmed (e.g., Region<4> and Region<5>) in the target bank are different, where the high 3-bit address of the row address of Region<4> is 100, and the high 3-bit address of the row address of Region<5> is 101.

In 115, generating, based on the target code and the row address of the storage region to be trimmed, a region selection signal configured to select the storage region to be trimmed in the target bank.

In some possible implementations, generating, based on the target code and the row address of the storage region to be trimmed, the region selection signal configured to select the storage region to be trimmed in the target bank may include: inputting the target code and the row address of the storage region to be trimmed into a logic circuit including a NAND gate, the logic gate circuit being configured to output the region selection signal configured to select the storage region to be trimmed in the target bank.

In 117, trimming the storage region to be trimmed based on the region selection signal to configure the density of the target bank.

According to the embodiments of the disclosure, when the density configuration parameter of the target bank includes the storage region to be trimmed in the target bank or the available storage region in the target bank, the storage region to be trimmed may be determined according to the storage region to be trimmed in the target bank or the available storage region in the target bank, and the code corresponding to the storage region to be trimmed is determined as the target code; when the density configuration parameter of the target bank includes the target density of the target bank, multiple codes corresponding to the target density of the target bank may be determined, and any one of the multiple codes may be taken as the target code. In such way, since the density configuration parameter is determined according to the actual situation of the target bank, the determined target code corresponds to the storage region to be trimmed which is determined according to the actual situation of the target bank, so that the determined target code can better meet the actual demands of the actual density configuration. Moreover, since the region selection signal is generated according to the target code and the row address of the storage region to be trimmed simultaneously, the determined region selection signal may be used to perform the trimming of the storage region to be trimmed in the target bank accurately.

An embodiment of the disclosure provides a method for density configuration of a bank of a semiconductor memory, which includes the operations 201 to 213 including:

In 201, determining a target bank to be configured of the memory.

In 203, determining a density configuration parameter of the target bank, the density configuration parameter being configured to represent a density to be configured for the target bank.

In 205, determining a target code from a set of codes of the target bank based on the density configuration parameter of the target bank, the target code corresponding to a storage region to be trimmed in the target bank.

In 207, determining the storage region to be trimmed in the target bank based on the target code.

In 209, performing logic processing on the target code and a row address of the storage region to be trimmed corresponding to the target code to obtain a target level.

In a possible implementation, performing the logic processing on the target code and the row address of the storage region to be trimmed corresponding to the target code to obtain the target level may include: performing the logic processing on the target code and a high-bit address of the row address of the storage region to be trimmed corresponding to the target code to obtain the target level. Here, the high-bit address is configured to distinguish different storage regions in the target bank.

It should be understood that the high-bit address of the row address of the storage region to be trimmed may be a high 3-bit address or a high 2-bit address in the row address. In an example, the density of the target bank Bank8 is 1 Gb, and Bank8 includes 6 regions, e.g., Region<5:0>. The high 3-bit address of the row address of the storage region to be trimmed (e.g., Region<4>) is 100, and the high 3-bit address of the row address of the storage region to be trimmed (e.g., Region<5>) is 101.

In an example, the target code may be understood as a mapping factor configured to map the row address.

In a possible implementation, performing the logic processing on the target code and the row address of the storage region to be trimmed corresponding to the target code to obtain the target level may include: inputting the target code and the row address of the storage region to be trimmed corresponding to the target code into a decoder including a NAND gate, and performing logic processing on the target code and the row address of the storage region to be trimmed corresponding to the target code through the decoder to obtain the target level after the logic processing.

In 211, taking the target level as a region selection signal; and

In 213, trimming the storage region to be trimmed based on the region selection signal to configure the density of the target bank.

According to the embodiments of the disclosure, logic processing is performed on the target code and the high-bit address of the row address of the storage region to be trimmed corresponding to the target code, the target level obtained through the logic processing is taken as the region selection signal. Since the target level is obtained by mapping the high-bit address of the row address by taking the code corresponding to the storage region to be trimmed as the mapping factor, the obtained region selection signal may be used to perform the trimming of the storage region to be trimmed more accurately.

An embodiment of the disclosure provides a method for density configuration of a bank of a semiconductor memory, which includes the operations 301 to 311 including:

In 301, determining a target bank to be configured of the memory.

In 303, determining a density configuration parameter of the target bank, the density configuration parameter being configured to represent a density to be configured for the target bank.

In 305, determining a maximum density of the target bank, when the density configuration parameter of the target bank includes a target density of the target bank.

It should be understood that the maximum density of the target bank may be the density of the target bank without being damaged or trimmed. For example, the maximum density of the target bank may be 1 Gb.

In 307, determining, when the target density is less than the maximum density, a target code from a set of codes of the target bank based on the target density, the target code corresponding to a storage region to be trimmed in the target bank.

It should be understood that during the density configuration of the target bank of the semiconductor memory, the target density must be less than or equal to the maximum density of the target bank, i.e., the density of the target bank can only be configured to be less than the maximum density of the target bank, and the density of the target bank cannot be configured to be greater than the maximum density of the target bank. For example, when the maximum density of the target bank of the semiconductor memory is 1 Gb, the target density is required to be less than or equal to 1 Gb, and cannot be greater than 1 Gb.

In a possible implementation, determining, when the target density is less than the maximum density, the target code from the set of codes of the target bank based on the target density may include: determining, when the target density of the target bank is less than the maximum density of the target bank, a density of the storage region to be trimmed according to a difference between the maximum density and the target density; determining whether the target bank has a damaged region or not; in response to determining that the target bank has a damaged region, determining the damaged region and a density of the damaged region, and determining the storage region to be trimmed according to the density of the storage region to be trimmed, the damaged region and the density of the damaged region; and determining a code corresponding to the storage region to be trimmed as the target code from the set of codes of the target bank.

In another possible implementation, determining, when the target density is less than the maximum density, the target code from the set of codes of the target bank based on the target density may include: determining, when the target density of the target bank is less than the maximum density of the target bank, a density of the storage region to be trimmed according to a difference between the maximum density and the target density; determining whether the target bank has a damaged region or not; in response to determining that the target bank has no damaged region, determining, as the storage region to be trimmed, any storage region with the same density as the storage region to be trimmed; and determining a code corresponding to the storage region to be trimmed as the target code from the set of codes of the target bank.

In 309, generating, based on the target code, a region selection signal configured to select the storage region to be trimmed in the target bank.

In 311, trimming the storage region to be trimmed based on the region selection signal to configure the density of the target bank.

According to the embodiment of the disclosure, the target code is determined from the set of codes of the target bank based on the target density when the target density of the target bank is determined to be less than the maximum density. In such a way, the density of banks of the semiconductor memory can be configured reasonably.

An embodiment of the disclosure provides another method for density configuration of a bank of a semiconductor memory, which includes the operations 401 to 411 including:

In 401, determining a target bank to be configured of the memory, the target bank including at least two logic storage regions, each of the at least two logic storage regions includes at least two consecutive physical storage regions, and a storage region to be trimmed in the target bank including at least two consecutive physical storage regions to be trimmed.

In a possible implementation, a density of the target bank is 1 Gb, and the target bank may include 6 regions, e.g., Region<5:0>, where Region<1:0> may be a logic storage region 1, Region<3:2> may be a logic storage region 2, and Region<5:4> may be a logic storage region 3, i.e., the target bank includes three logic storage regions. Region<0> to Region<5> may include physical storage regions 1 to 6, where the logic storage region 1 may include consecutive Region<0> and Region<1>, the logic storage region 2 may include consecutive Region<2> and Region<3>, and the logic storage region 3 may include consecutive Region<4> and Region<5>. It can be seen that each logic storage region includes two consecutive physical storage regions.

In 403, determining a density configuration parameter of the target bank, the density configuration parameter being configured to represent a density to be configured for the target bank.

In 405, determining, when the density configuration parameter of the target bank includes the physical storage regions to be trimmed in the target bank, a logic storage region to be trimmed from the at least two logic storage regions in the target bank based on the at least two consecutive physical storage regions to be trimmed in the target bank.

It should be understood that according to the embodiment of the disclosure, the trimming is perform in a unit of a logic storage region, i.e., as long as any physical storage region in the logic storage region is damaged, the logic storage region in which the physical storage region is located is required to be trimmed. For example, for the logic storage region Region<1:0>, when the physical storage region Region<1> is damaged, the logic storage region Region<1:0> in which Region<1> is located is required to be trimmed.

In some possible implementations, determining, when the density configuration parameter of the target bank includes the physical storage regions to be trimmed in the target bank, a logic storage region to be trimmed from the at least two logic storage regions in the target bank based on the physical storage regions to be trimmed in the target bank may include: determining, as the logic storage region to be trimmed, a logic storage region including the physical storage regions to be trimmed among the at least two logic storage regions in the target bank, when the density configuration parameter of the target bank includes the physical storage regions to be trimmed in the target bank.

In 407, determining a target code from a set of codes of the target bank based on the logic storage region to be trimmed, the target code corresponding to the storage region to be trimmed in the target bank.

It should be understood that the logic storage region to be trimmed may be an implementation of the storage region to be trimmed.

In 409, generating, based on the target code, a region selection signal configured to select the storage region to be trimmed in the target bank.

In 411, trimming the storage region to be trimmed based on the region selection signal to configure the density of the target bank.

According to the embodiment of the disclosure, the minimum unit of the trimming for the target bank is determined as a logic storage region, and if the physical storage region belonging to the logic storage region is damaged, the logic storage region in which the physical storage region is located is required to be trimmed, so that the possibility of missing the trimming for the damaged storage region can be reduced.

An embodiment of the disclosure provides another method for density configuration of a bank of a semiconductor memory, which includes the operations 501 to 521 including:

In 501, determining a target bank to be configured of the memory, the target bank including at least two logic storage regions, each of the at least two logic storage regions includes at least two consecutive physical storage regions.

In 503, determining a density configuration parameter of the target bank, the density configuration parameter being configured to represent a density to be configured for the target bank, and the density configuration parameter of the target bank including a target density of the target bank.

In 505, determining a density of each physical storage region in the target bank.

It should be understood that the density of each physical storage region is equal to a ratio of a total density of the target bank to the number of the physical storage regions in the target bank. For example, if the total density of the target bank is 1 Gb and the number of the physical storage regions is 6, the density of each physical storage region is ($\frac{1}{6}$) Gb.

In 507, determining the number of the consecutive physical storage regions in each logic storage region.

In an example, the number of the consecutive physical storage regions in each logic storage region may be 2, or may be an integer larger than 2.

In a possible implementation, the number of the consecutive physical storage regions in each logic storage region is determined according to the number of bits of each code among of the set of codes of the target bank and the number of the physical storage regions in the target bank.

In 509, determining, based on the number of the consecutive physical storage regions in each logic storage region and the density of each physical storage region, a density of the logic storage region.

In some possible implementations, determining, based on the number of the consecutive physical storage regions in each logic storage region and the density of each physical storage region, the density of the logic storage region may include: determining a product of the number of the consecutive physical storage regions in each logic storage region and the density of each physical storage region as the density of the logic storage region. For example, if the number of the consecutive physical storage regions in each logic storage region is 2 and the density of each physical storage region is ($\frac{1}{3}$) Gb, the density of each logic storage region is ($\frac{2}{3}$) Gb.

In 511, determining a maximum density of the target bank.

It should be understood that the maximum density of the target bank may be the density of the target bank without being damaged or trimmed. Determining the maximum density of the target bank may include obtaining the maximum density from factory test data of the semiconductor memory.

In a possible implementation, the maximum density of the target bank Bank8 is 1 Gb and Bank8 includes 6 physical storage regions, e.g., Region<5:0>, where every two consecutive physical storage regions are determined as a logic storage region, so that a logic storage region 1 (e.g., Region<1:0>), a logic storage region 2 (e.g., Region<3:2>) and a logic storage region 3 (e.g., Region<5:4>) are formed. It can be seen that the density of each physical storage region is ($\frac{1}{6}$) Gb and the density of each logic storage region is ($\frac{1}{3}$) Gb.

In 513, determining at least one configurable density of the target bank based on the density of each logic storage region and the maximum density of the target bank, the density of each logic storage region being a sum of densities of respective physical storage regions in the logic storage region.

According to an embodiment, if the logic storage region includes two physical storage regions and the density of each physical storage region is ($\frac{1}{6}$) Gb, the density of the logic storage region is ($\frac{1}{3}$) Gb.

According to an embodiment, determining the at least one configurable density of the target bank based on the density of each logic storage region and the maximum density of the target bank may include: determining a difference between the maximum density of the target bank and an integer multiple of the density of each logic storage region as the at least one configurable density of the target bank. For example, if the maximum density of the target bank is 1 Gb and the density of the logic storage region is (⅓) Gb, the at least one configurable density of the target bank may include (⅓) Gb, (⅔) Gb and 1 Gb, each of which is an integer multiple of (⅓) Gb.

In 515, determining an actual density to be configured based on the at least one configurable density and the target density.

In a possible implementation, determining the actual density to be configured based on the at least one configurable density and the target density may include: comparing the at least one configurable density and the target density, and determining, as the actual density to be configured, a configurable density among the at least one configurable density that is closest to and less than the target density.

It should be understood that when the maximum density of the target bank is 1 Gb, and when the density of the logic storage region is (⅓) Gb and the target density is (⅚) Gb, the at least one configurable density may include at least (⅓) Gb and (⅔) Gb. Since (⅔) Gb is the configurable density closest to (⅚) Gb ((⅚) Gb is not an integer multiple of the density of the logic storage region), the actual density to be configured may be determined to be (⅔) Gb.

In 517, determining, when the actual density is inconsistent with the target density, a target code from a set of codes of the target bank based on the actual density, the target code corresponding to a storage region to be trimmed in the target bank.

It should be understood that because the configurable density may be actually implemented or obtained, when the actual density is inconsistent with the target density, the target code may be determined from the set of codes of the target bank according to the actual density.

In 519, generating, based on the target code, a region selection signal configured to select the storage region to be trimmed in the target bank.

In 521, trimming the storage region to be trimmed based on the region selection signal to configure the density of the target bank.

According to the embodiment of the disclosure, the density of each logic storage region may be determined according to the density of each physical storage region and the number of the consecutive physical storage regions in the logic storage region; the at least one configurable density of the target bank may be determined according to the density of each logic storage region and the maximum density of the target bank; and the actual density to be configured may be determined according to the at least one configurable density and the target density of the target bank; and the target code may be determined based on the actual density, when the actual density is inconsistent with the target density.

An embodiment of the disclosure provides another method for density configuration of a bank of a semiconductor memory, which includes the operations 601 to 623 including:

In 601, determining a target bank to be configured of the memory, the target bank including at least two logic storage regions, each of the at least two logic storage regions includes at least two consecutive physical storage regions.

In 603, determining a density configuration parameter of the target bank, the density configuration parameter being configured to represent a density to be configured for the target bank, and the density configuration parameter of the target bank including a target density of the target bank.

In 605, determining a density of each physical storage region in the target bank.

In 607, determining the number of bits of each code among a set of codes of the target bank.

It should be understood that the number of bits of each code among the set of codes of the target bank is determined according to the number of logic storage regions in the target bank. For example, if the number of bits of each code among the set of codes of the target bank is 2, the number of the logic storage regions cannot be larger than the power of 2.

In 609, determining the number of physical storage regions in each logic storage region based on the number of physical storage regions in the target bank and the number of bits of each code.

In some possible implementations, determining the number of physical storage regions in each logic storage region based on the number of physical storage regions in the target bank and the number of bits of each code may include: determining, according to the number of bits of each code, the maximum number of logic storage regions capable of being distinguished by the set of codes of the target bank; and determining the number of consecutive physical storage regions in each logic storage region according to the determined maximum number of the logic storage regions and the number of physical storage regions.

According to an embodiment, determining the number of consecutive physical storage regions in each logic storage region according to the determined maximum number of logic storage regions and the number of physical storage regions may include: determining the number of the consecutive physical storage region in each logic storage region to be 1, when the maximum number of the logic storage regions is greater than or equal to the number of the physical storage regions; determining the number of the consecutive physical storage regions in each logic storage region to be 2, when the maximum number of the logic storage regions is less than the number of the physical storage regions and twice the maximum number of the logic storage regions is greater than the number of the physical storage regions.

For example, if the number of bits of each code among the set of codes of the target bank is 2, and the number of the physical storage regions is 6, the maximum number of the logic storage regions (which is determined based on the number of bits of each code among the set of codes of the target bank being 2) may be determined to be 4. It is clear that the maximum number 4 of the logic storage regions is less than the number 6 of the physical storage regions, but twice the maximum number of the logic storage regions (i.e., 8) is greater than the number 6 of the physical storage regions, and thus the number of the consecutive physical storage regions in each logic storage region may be determined to be 2.

For another example, if the number of bits of each code among the set of codes of the target bank is 3, and the number of the physical storage regions is 6, the maximum number of the logic storage regions (which is determined based on the number of bits of each code among the set of codes of the target bank being 3) may be determined to be 8. It is clear that the maximum number 8 of the logic storage regions is greater than the number 6 of the physical storage regions, and thus the number of the consecutive physical storage region in each logic storage region may be determined to be 1.

In 611, determining, based on the number of consecutive physical storage regions in each logic storage region and the density of each physical storage region, a density of the logic storage region.

In a possible implementation, determining, based on the number of consecutive physical storage regions in each logic storage region and the density of each physical storage region, the density of the logic storage region may include: determining a product of the number of the consecutive physical storage regions in each logic storage region and the density of each physical storage region to be the density of the logic storage region. For example, if the number of the consecutive physical storage regions in each logic storage region is 2 and the density of each physical storage region is (⅙) Gb, the density of each logic storage region may be determined to be (⅓) Gb.

In 613, determining a maximum density of the target bank.

In 615, determining at least one configurable density of the target bank based on the density of each logic storage region and the maximum density of the target bank, the density of each logic storage region being a sum of densities of respective physical storage regions in the logic storage region.

In 617, determining an actual density to be configured based on the at least one configurable density and the target density.

In 619, determining, when the actual density is inconsistent with the target density, a target code from the set of codes of the target bank based on the actual density, the target code corresponding to a storage region to be trimmed in the target bank.

In 621, generating, based on the target code, a region selection signal configured to select the storage region to be trimmed in the target bank.

In 623, trimming the storage region to be trimmed based on the region selection signal to configure the density of the target bank.

According to the embodiment of the disclosure, the number of the consecutive physical storage regions in each logic storage region may be accurately determined according to the number of bits of each code among the set of codes of the target bank and the number of the physical storage regions in the target bank.

According to the embodiment of the disclosure, if the maximum density of the target bank without being damaged or trimmed is 1 Gb, the density of (⅔) Gb may be implemented by trim. The target bank is divided into 6 regions, e.g., Region<5:0>, if the density of the target bank is 1 Gb, all the 6 regions including Region<5:0> are utilized; if the density of the target bank is (⅔) Gb, 4 regions are selected from the 6 regions including Region<5:0>. For example, a die of a DRAM may include 16 banks, and the density of each bank may be 1 Gb (which means that the bank includes at least 2^30 storage capacitors; in fact, the DRAM further includes redundant storage capacitors, and if the density of the bank is 1 Gb, the bank includes more than 2^30 storage capacitors), thus the density of the full die may reach 16 Gb. If partial storage capacitors of a die cannot work due to manufacturing process or other reasons, the density of the die may be configured to 12 Gb, 8 Gb, 4 Gb or 2 Gb through trim, so that the DRAM die may be utilized as much as possible, when the partial storage capacitors cannot work.

TABLE 1

| trim_halfGoodBnk<1:0> | | | | Density |
|---|---|---|---|---|
| 00 | Region<0, 1> | Region<2, 3> | Region<4, 5> | 1 Gb |
| 01 | Region<0, 1> | Region<2, 3> | | (2/3)Gb |
| 10 | Region<0, 1> | | Region<4, 5> | (2/3)Gb |
| 11 | | Region<2, 3> | Region<4, 5> | (2/3)Gb |

With reference to Table 1, it can be seen that when trim_halfGoodBnk<1:0>=01, 4 regions including Region<3:0> are selected and Region<4,5> is trimmed to implement the density of (⅔) Gb; when trim_halfGoodBnk<1:0>=10, 4 regions including Region<1:0> and Region<5:4> are selected and Region<3,2> is trimmed to implement the density of (⅔) Gb; when trim_halfGoodBnk<1:0>=11, 4 regions including Region<5:2> are selected and Region<1:0> is trimmed to implement the density of (⅔) Gb.

Figure 3A:
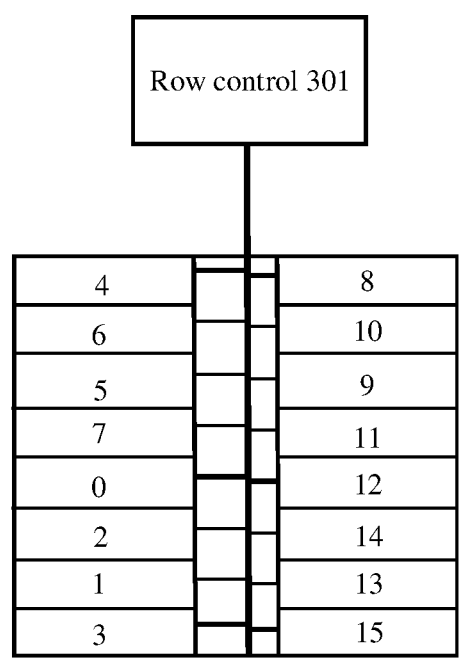
FIG. 3A is a structural diagram of storage regions and addresses of a full-chip according to an embodiment of the disclosure.

FIG. 3A is a structural diagram of storage regions and addresses of a full-chip according to an embodiment of the disclosure. As shown in FIG. 3A, the full-chip includes 16 banks, where the number of bits of a row control line guided by the row control 301 is 16; Bank4, Bank6, Bank5, Bank7, Bank0, Bank2, Bank1 and Bank3 are distributed on the left side; and Bank8, Bank10, Bank9, Bank11, Bank 12, Bank 14, Bank 13 and Bank 15 are distributed on the right side.

Figure 3B:
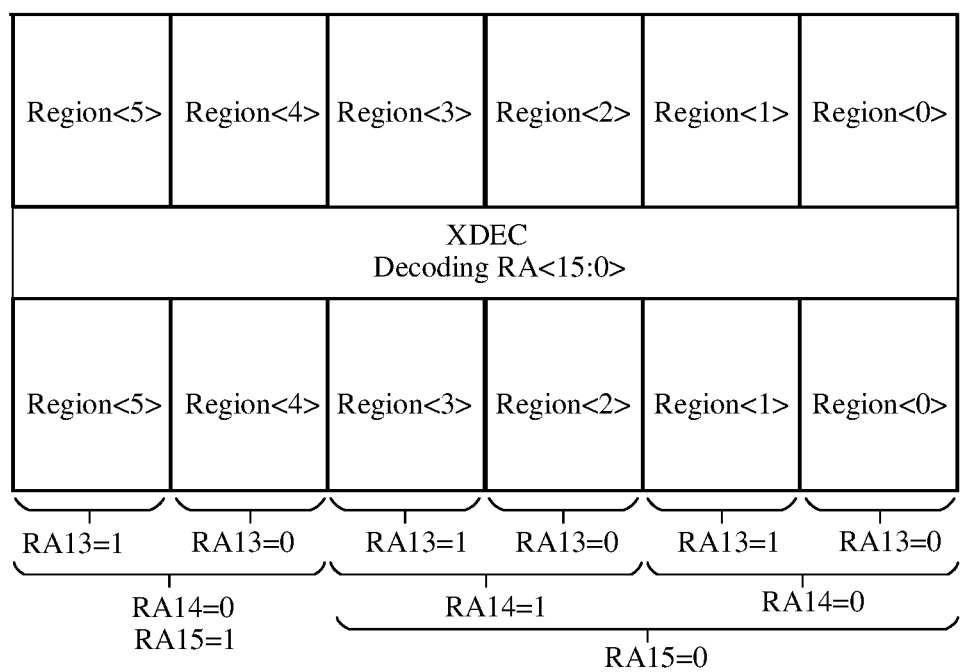
FIG. 3B is an enlarged structural diagram of Bank8 of FIG. 3A according to an embodiment of the disclosure.

FIG. 3B is an enlarged structural diagram of Bank8 of FIG. 3A according to an embodiment of the disclosure. As shown in FIG. 3B, Bank 8 includes 6 physical storage regions from Region<0> to Region<5>, where the 6 regions from Region<0> to Region<5> are encoded by Ra<15>, Ra<14> and Ra<13> in a row address Ra<15:0>. It can be seen that a code corresponding to Region<0> is 000; a code corresponding to Region<1> is 001; a code corresponding to Region<2> is 010; a code corresponding to Region<3> is 011; a code corresponding to Region<4> is 100; and a code corresponding to Region<5> is 101.

Figure 3C:
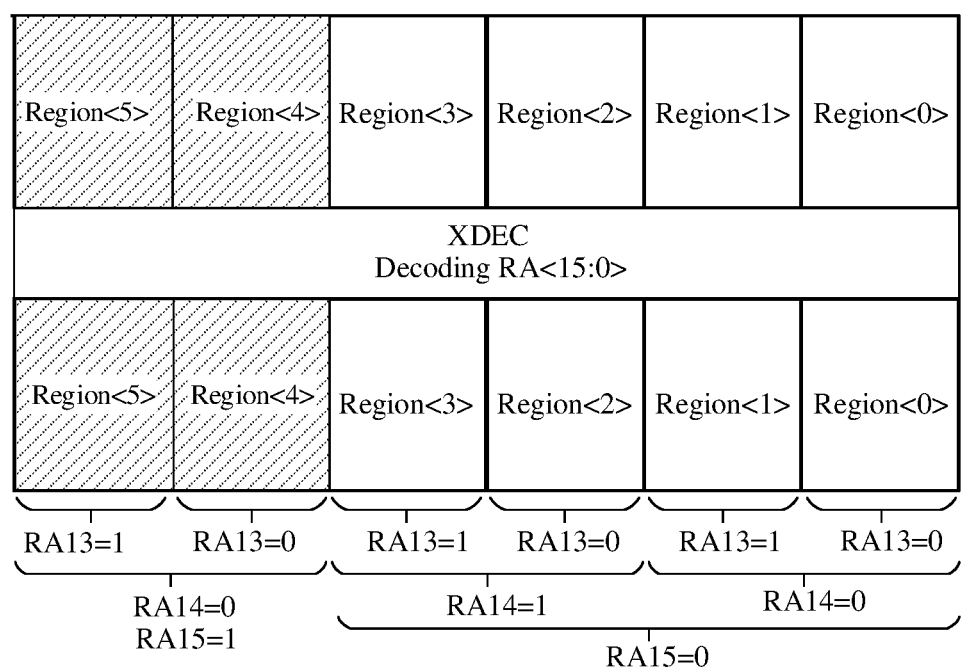
FIG. 3C is a structural diagram of Bank8 after trimming according to an embodiment of the disclosure.

FIG. 3C is a structural diagram of Bank8 after trimming according to an embodiment of the disclosure. As shown in FIG. 3C, two consecutive physical storage regions (i.e., Region<4> and Region<5>) of Bank8 are trimmed to change the density of Bank8 from 1 Gb to (⅔) Gb. For example, Region<4> and Region<5> may be the damaged physical storage regions, or may be any two consecutive physical storage regions randomly selected when each physical storage region from Region<0> to Region<5> is not damaged.

According to the embodiment of the disclosure, in the process of generating, based on the target code, the region selection signal configured to select the storage region to be trimmed in the target bank, the target code is required to be decoded. Herein, three region selection signals (e.g., Ra1514<0>, Ra1514<1> and Ra1514<2>) are defined. The relations between (Ra1514<0>, Ra1514<1>, and Ra1514<2>) and each storage region may be understood with reference to Table 2.

TABLE 2

| Ra1514<0> | | Ra1514<1> | | Ra1514<2> | |
|---|---|---|---|---|---|
| Ra13 = 0 | Ra13 = 1 | Ra13 = 0 | Ra13 = 1 | Ra13 = 0 | Ra13 = 1 |
| Region<0> | Region<1> | Region<2> | Region<3> | Region<4> | Region<5> |

As shown in Table 2, Ra1514<0> represents 2 regions including Region<0,1>; Ra1514<1> represents 2 regions including Region<2,3>; and Ra1514<2> represents 2 regions including Region<4,5>.

The region selection signal (e.g., Ra1514<0>, Ra1514<1>, Ra1514<2>) may be obtained by performing logic processing on a target code and a high 2-bit address (Ra<15> and Ra<14>) of Bank8 through a logic circuit.

Before obtaining the region selection signal (e.g., Ra1514<0>, Ra1514<1>, Ra1514<2>), some intermediate signals may be determined, such as a signal obtained by performing logic NOT operation on the target code, a signal obtained by performing logic NOT operation on Ra<15:14>, and the like.

Figure 3D:
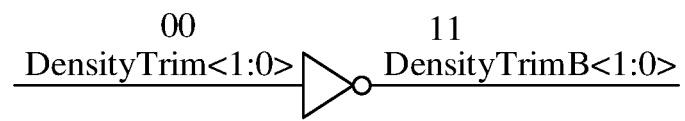
FIG. 3D is a logic circuit diagram of performing logic NOT operation on a target code according to an embodiment of the disclosure.

FIG. 3D is a logic circuit diagram of performing logic NOT operation on a target code according to an embodiment of the disclosure. As shown in FIG. 3D, DensityTrim<1:0> represents the target code, and DensityTrimB<1:0> may be obtained by performing logic NOT operation on DensityTrim<1:0>.

Figure 3E:
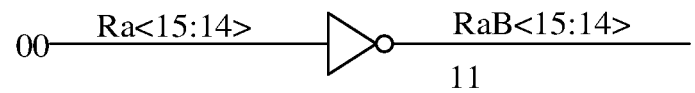
FIG. 3E is a logic circuit diagram of performing logic NOT operation on Ra<15:14> according to an embodiment of the disclosure.

FIG. 3E is a logic circuit diagram of performing logic NOT operation on a high 2-bit address according to an embodiment of the disclosure. As shown in FIG. 3E, Ra<15:14> is the high 2-bit address, and RaB<15:14> may be obtained by performing logic NOT operation on Ra<15:14>.

Figure 3F:
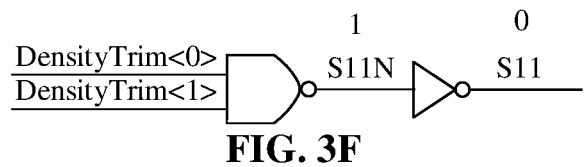
FIG. 3F is a logic circuit diagram of performing logic operation on DensityTrim<0> and DensityTrim<1> according to an embodiment of the disclosure.

FIG. 3F is a logic circuit diagram of performing logic operation on DensityTrim<0> and DensityTrim<1> according to an embodiment of the disclosure. As shown in FIG. 3F, S11N may be obtained by performing logic NAND operation on DensityTrim<0> and DensityTrim<1>, and S11 may be obtained by performing logic NOT operation on S11N.

Figure 3G:
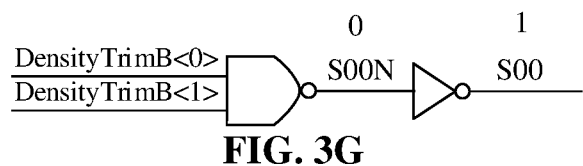
FIG. 3G is a logic circuit diagram of performing logic operation on DensityTrimB<0> and DensityTrimB<1> according to an embodiment of the disclosure.

FIG. 3G is a logic circuit diagram of performing logic operation on DensityTrimB<0> and DensityTrimB<1> according to an embodiment of the disclosure. As shown in FIG. 3G, S00N may be obtained by performing logic NAND operation on DensityTrim<0> and DensityTrim<1>, and S00 may be obtained by performing logic NOT operation on S00N.

Figure 3H:
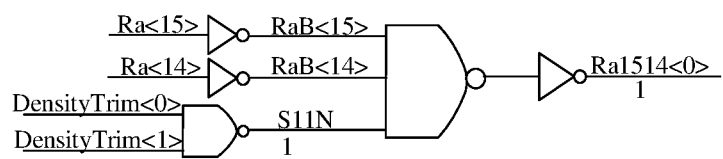
FIG. 3H is a logic circuit diagram of obtaining a region selection signal Ra1514<0> based on a target code and a high 2-bit address according to an embodiment of the disclosure.

FIG. 3H is a logic circuit diagram of obtaining the region selection signal Ra1514<0> based on a target code and a high 2-bit address according to an embodiment of the disclosure. As shown in FIG. 3H, Ra1514<0> may be obtained by performing logic NOT operation on a logic result which is obtained by performing logic NAND operation on RaB<15>, RaB<14> and S11N.

Figure 3I:
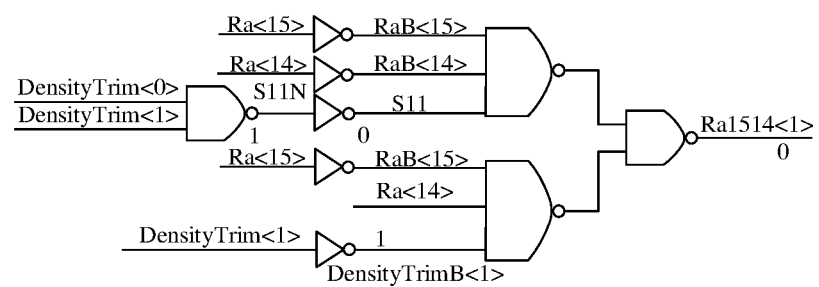
FIG. 3I is a logic circuit diagram of obtaining a region selection signal Ra1514<1> based on a target code and a high 2-bit address according to an embodiment of the disclosure.

FIG. 3I is a logic circuit diagram of obtaining the region selection signal Ra1514<1> based on a target code and a high 2-bit address according to an embodiment of the disclosure. As shown in FIG. 3I, logic NAND operation is performed on RaB<15>, RaB<14> and S11 to obtain a first logic result; and logic NAND operation is performed on RaB<15>, Ra<14> and DensityTrimB<1> to obtain a second logic result; and logic NAND operation is performed on the first logic result and the second logic result to obtain Ra1514<1>.

Figure 3J:
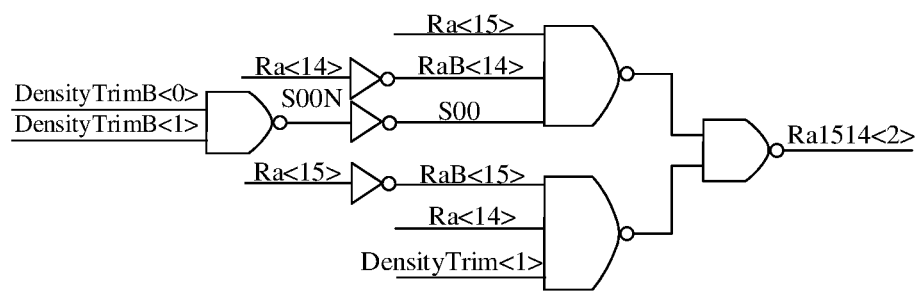
FIG. 3J is a logic circuit diagram of obtaining a region selection signal Ra1514<2> based on a target code and a high 2-bit address according to an embodiment of the disclosure.

FIG. 3J is a logic circuit diagram of obtaining the region selection signal Ra1514<2> based on a target code and a high 2-bit address according to an embodiment of the disclosure. As shown in FIG. 3J, logic NAND operation is performed on Ra<15>, RaB<14> and S00 to obtain a third logic result; logic NAND operation is performed on RaB<15>, Ra<14> and DensityTrim<1> to obtain a fourth logic result; and logic NAND operation is performed on the third logic result and the fourth logic result to obtain Ra1514<2>.

According to the embodiments of the disclosure, there are multiple options for density configuration of a target bank, which may be understood with reference to Table 3.

TABLE 3

| Density<1:0> | | | |
|---|---|---|---|
| 00 (1 Gb) | Ra1514<0> | Ra1514<1> | Ra1514<2> |
| 01 ((2/3) Gb) | Ra1514<0> | Ra1514<2> | Ra1514<2> = 0 |
| 10 ((2/3) Gb) | Ra1514<0> | Ra1514<1> = 0 | Ra1514<2> |
| 11 ((2/3) Gb) | Ra1514<0> = 0 | Ra1514<1> | Ra1514<2> |

As shown in Table 3, Density<1:0> may represent different densities. Density<1:0> is 00 which represents that the density of the target bank is 1 Gb, and Ra1514<0> to Ra1514<2> are all 1 which represents that Region<0> to Region<5> are all 1 (because Ra1514<0> represents Region<0,1>, Ra1514<1> represents Region<2,3>, and Ra1514<2> represents Region<4,5>), i.e., available.

Density<1:0> is 01 which represents that the density of the target bank is (⅔) Gb, and Ra1514<0> and Ra1514<1> are 1 and Ra1514<2> is 0 which represent that Region<0> to Region<3> are all 1 (available) and Region<4> and Region<5> are 0 (unavailable) (because Ra1514<0> represents Region<0,1>, Ra1514<1> represents Region<2,3>, and Ra1514<2> represents Region<4,5>).

Density<1:0> is 10 which represents that the density of the target bank is (⅔) Gb, and Ra1514<0> and Ra1514<2> are 1 and Ra1514<1> is 0 which represent that Region<0>, Region<1>, Region<4> and Region<5> are all 1 (available) and Region<2> and Region<3> are 0 (unavailable) (because Ra1514<0> represents Region<0,1>, Ra1514<1> represents Region<2,3>, and Ra1514<2> represents Region<4,5>).

Density<1:0> is 11 which represents that the density of the target bank is (⅔) Gb, and Ra1514<0> is 0 and Ra1514<1> and Ra1514<2> are 1 which represent that Region<0> and Region<1> are 0 (unavailable) and Region<2> to Region<5> are all 1 (available) (because Ra1514<0> represents Region<0:1>, Ra1514<1> represents Region<2:3>, and Ra1514<2> represents Region<4:5>).

Figure 4:
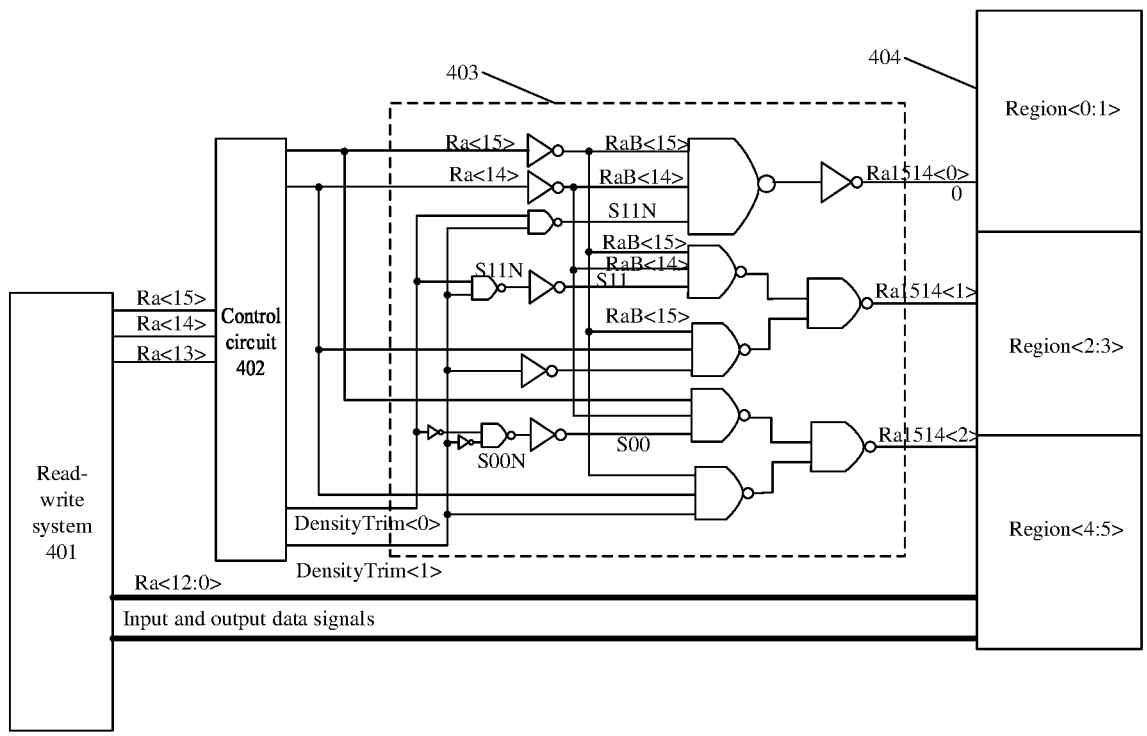
FIG. 4 is a structural diagram of a system for density configuration of a bank of a semiconductor memory according to an embodiment of the disclosure.

FIG. 4 illustrates a structural diagram of a system for density configuration of a bank of a semiconductor memory according to an embodiment of the disclosure. As shown in FIG. 4, the system structure includes a read-write system 401, a control circuit 402, a decoding unit 403 and a bank 404. Ra<12:0> in a row address line Ra<15:0> guided by the read-write system 401 is directly connected to the bank 404, and Ra<15:13> is connected to the control circuit 402. The control circuit 402 is configured to input Ra<15:13> and the generated DensityTrim<1:0> into the decoding unit 403. The decoding unit 403 is connected to the bank 404, and the decoding unit 403 is configured to perform logic operation on Ra<15:13> and DensityTrim<1:0> to obtain a region selection signal, and transmit the obtained region selection signal to the bank 404. The bank 404 is configured to trim a corresponding region to be trimmed according to the region selection signal to configure the density of the bank.

It should be understood that the decoding unit 403 may be implemented by the circuits shown in FIG. 3H to FIG. 3J. The reference may be made in the foregoing description.

According to the embodiment of the disclosure, different encoding states of Ra1514<2:0> correspond to different regions of the bank 404, for example, the region corresponding to Ra1514<2:0>=100 is Region<0:1>.

Figure 5:
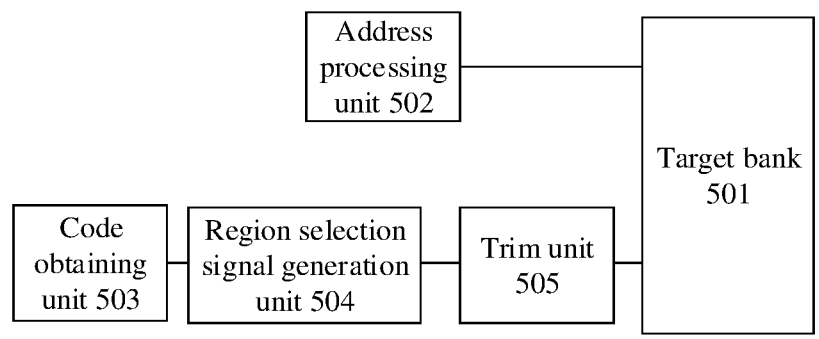
FIG. 5 is a structural diagram of a semiconductor memory according to an embodiment of the disclosure.

Furthermore, an embodiment of the disclosure further provides a semiconductor memory, which supports the methods for density configuration of the bank of the semiconductor memory according the foregoing embodiments. FIG. 5 is a structural diagram of the semiconductor memory according to the embodiment of the disclosure. As shown in FIG. 5, the semiconductor memory includes a target bank 501, an address processing unit 502, a code obtaining unit 503 and a region selection signal generation unit 504 and a trim unit 505.

The target bank 501 includes at least two storage regions.

The address processing unit 502 is configured to output an address of the target bank 501, here, an output terminal of the address processing unit 502 is connected to the target bank 501.

The code obtaining unit 503 is configured to receive a target code, here, the target code corresponds to at least one storage region to be trimmed in the target bank 501.

The region selection signal generation unit 504 is configured to generate, based on the target code, a region selection signal configured to select the storage region to be trimmed in the target bank 501, here, an output terminal of the region selection signal generation unit 504 is connected to an input terminal of a trim unit 505.

The trim unit 505 is configured to trim the storage region to be trimmed based on the region selection signal to configure a density of the target bank 501, here, an output terminal of the trim unit 505 is connected to the target bank 501.

According to some embodiments, the semiconductor memory further includes: a control unit, configured to determine the target bank 501 to be configured of the semiconductor memory; to determine a density configuration parameter of the target bank 501, here, the density configuration parameter is configured to represent the density to be configured for the target bank 501; and to determine the target code from a set of codes of the target bank 501 based on the density configuration parameter of the target bank 501, here, the target code corresponds to the storage region to be trimmed in the target bank 501. An output terminal of the control unit is connected to the code obtaining unit.

According to some embodiments, the address processing unit 502 includes: a row address processing unit, configured to output a row address of the target bank 501, here, an output terminal of the row address processing unit is connected to an input terminal of the region selection signal generation unit and the target bank 501; a column address processing unit, configured to output a column address of the target bank 501, here, an output terminal of the column address processing unit is connected to the target bank 501; and a bank address processing unit, configured to output a bank address of the target bank 501, here, an output terminal of the bank address processing unit is connected to the target bank 501. The region selection signal generation unit 504 is configured to perform logic processing on the target code and a row address of the storage region to be trimmed corresponding to the target code to obtain a target level, and take the target level as the region selection signal.

According to some embodiments, an output terminal of a high-bit address in the row address processing unit is connected to the input terminal of the region selection signal generation unit; here, the high-bit address is configured to distinguish different storage regions in the target bank 501.

According to some embodiments, the region selection signal generation unit 504 includes a logic gate circuit including a NAND gate and a NOT gate, here, an input terminal of the logic gate circuit includes a signal line corresponding to the target code and a signal line corresponding to the row address of the storage region to be trimmed; and the logic gate circuit is configured to perform logic processing on the target code and the row address of the storage region to be trimmed corresponding to the target code to obtain the target level, and to take the target level as the region selection signal.

According to some embodiments, the region selection signal generation unit 504 includes a decoder. Here, an input terminal of the decoder is a signal line corresponding to the target code; and each level output by the decoder is taken as the region selection signal when the level is valid, and each output terminal of the decoder is connected to the input terminal of the trim unit.

In some examples, the terms "module" and "unit" and the like in the semiconductor memory as shown in FIG. 5 may be implemented by one or more hardware circuits/sub-circuits and/or one or more processors. In some examples, a module or unit may include one or more circuits with or without stored code or instructions. The module or unit may include one or more components that are directly or indirectly connected. These components may or may not be physically attached to, or located adjacent to, one another.

The semiconductor memory according to the embodiments of the disclosure is similar to the methods for density configuration of the bank of the semiconductor memory according to the foregoing embodiments. The technical features not disclosed in detail according to the embodiments of the disclosure can be understood with reference to the foregoing embodiments, which will not be repeated herein.

The embodiments of the disclosure provide the semiconductor memory. Considering that the density configuration parameters of different target banks to be configured of the semiconductor memory may be different, the target codes determined based on the different density configuration parameters may further be different, and the region selection signals generated based on the different target codes may further be different. Therefore, different storage regions to be trimmed of different target banks to be configured can be trimmed through different region selection signals, so that the storage region(s) to be trimmed can be flexibly selected, and the effective utilization rate of the density configuration of the banks of the semiconductor memory is improved.

It should be understood that in the embodiments of the disclosure, the disclosed devices and methods may be implemented in a non-targeted manner. The foregoing device embodiments are merely illustrative. For example, the division of the units is only a logical function division. In actual implementation, there may be other division methods. For example, a plurality of units or components may be combined, or may be integrated into another system, or some features may be ignored or not implemented.

The features disclosed in the method or device embodiments of the disclosure may be combined arbitrarily without conflict to obtain new method or device embodiments.

The foregoing description is merely for the illustration of specific embodiments of the disclosure. The scope of protection of the disclosure is not limited thereto. Those skilled in the art may make modifications or substitutions within the technical scope of the disclosure, which shall fall within the scope of the disclosure. Therefore, the scope of protection of the disclosure shall be defined by the scope of the claims.

INDUSTRIAL APPLICABILITY

In the embodiments of the disclosure, since the density configuration parameters of different target banks to be configured may be different, the target codes determined based on the different density configuration parameters may be different, and the region selection signals generated based on the different target codes may further be different. Therefore, different storage regions to be trimmed of different target banks to be configured can be trimmed through different region selection signals, so that the storage region to be trimmed can be flexibly selected, thereby improving the effective utilization rate of the density configuration of the banks of the semiconductor memory.

The invention claimed is:

1. A method for density configuration of a bank of a semiconductor memory, comprising:
   determining a target bank to be configured of the semiconductor memory;
   determining a density configuration parameter of the target bank, wherein the density configuration parameter is configured to represent a density to be configured for the target bank;
   determining, based on the density configuration parameter of the target bank, a target code from a set of codes of the target bank, wherein the target code corresponds to a storage region to be trimmed in the target bank;
   generating, based on the target code, a region selection signal configured to select the storage region to be trimmed in the target bank; and
   trimming the storage region to be trimmed based on the region selection signal to configure the density of the target bank.

2. The method of claim 1, wherein the density configuration parameter of the target bank comprises at least one of:
   a target density of the target bank,
   the storage region to be trimmed in the target bank, or
   an available storage region in the target bank.

3. The method of claim 2, wherein in response to determining that the density configuration parameter of the target bank comprises the storage region to be trimmed in the target bank or the available storage region in the target bank,
   determining, based on the density configuration parameter of the target bank, the target code from the set of codes of the target bank comprises:
   determining the storage region to be trimmed based on the storage region to be trimmed or the available storage region; and
   determining, based on the storage region to be trimmed, the target code from the set of codes of the target bank, wherein each code among the set of codes of the target bank corresponds to at least one storage region to be trimmed in the target bank.

4. The method of claim 2, wherein in response to determining that the density configuration parameter of the target bank comprises the target density of the target bank,
   determining, based on the density configuration parameter of the target bank, the target code from the set of codes of the target bank comprises:
   determining, from the set of codes of the target bank, a plurality of codes corresponding to the density configuration parameter of the target bank; and
   randomly selecting, from the plurality of codes corresponding to the density configuration parameter of the target bank, a code as the target code.

5. The method of claim 1, wherein generating, based on the target code, the region selection signal configured to select the storage region to be trimmed in the target bank comprises:
   determining, based on the target code, a row address of the storage region to be trimmed in the target bank; and
   generating, based on the target code and the row address of the storage region to be trimmed, the region selection signal configured to select the storage region to be trimmed in the target bank.

6. The method of claim 5, wherein generating, based on the target code and the row address of the storage region to be trimmed, the region selection signal configured to select the storage region to be trimmed in the target bank comprises:
   performing logic processing on the target code and the row address of the storage region to be trimmed corresponding to the target code, to obtain a target level; and
   taking the target level as the region selection signal.

7. The method of claim 6, wherein performing logic processing on the target code and the row address of the storage region to be trimmed corresponding to the target code, to obtain a target level comprises:
   performing the logical processing on the target code and a high-bit address of the row address of the storage region to be trimmed, to obtain the target level, the high-bit address being configured to distinguish different storage regions in the target bank.

8. The method of claim 2, wherein in response to determining that the density configuration parameter of the target bank comprises the target density of the target bank,
   determining, based on the density configuration parameter of the target bank, the target code from the set of codes of the target bank comprises:
   determining a maximum density of the target bank; and
   determining, based on the target density, the target code from the set of codes of the target bank, in response to the target density being less than the maximum density.

9. The method of claim 2, wherein the target bank comprises at least two logic storage regions, and each of the at least two logic storage regions comprises at least two consecutive physical storage regions; wherein the storage region to be trimmed in the target bank comprises at least two consecutive physical storage regions to be trimmed; and
   wherein in response to determining that the density configuration parameter of the target bank comprises the physical storage regions to be trimmed in the target bank, determining, based on the density configuration parameter of the target bank, the target code from the set of codes of the target bank comprises:
  determining, based on the at least two consecutive physical storage regions to be trimmed in the target bank, a logic storage region to be trimmed from the at least two logic storage regions in the target bank; and
  determining, based on the logic storage region to be trimmed, the target code from the set of codes of the target bank.

10. The method of claim 1, wherein the density configuration parameter of the target banks comprises a target density of the target bank; wherein the target bank comprises at least two logic storage regions, and each of the at least two logic storage regions comprises at least two consecutive physical storage regions; and
  wherein determining, based on the density configuration parameter of the target bank, the target code from the set of codes of the target bank comprises:
    determining a density of each logic storage region and a maximum density of the target bank;
    determining at least one configurable density of the target bank based on the density of each logic storage region and the maximum density of the target bank, wherein the density of each logic storage region is a sum of densities of respective physical storage regions in the logic storage region;
    determining, based on the at least one configurable density and the target density, an actual density to be configured; and
    determining, based on the actual density, the target code from the set of codes of the target bank, in response to the actual density being inconsistent with the target density.

11. The method of claim 10, further comprising:
  determining a density of each physical storage region in the target bank;
  determining a number of the consecutive physical storage regions in each logic storage region; and
  determining, based on the number of the consecutive physical storage regions in each logic storage region and the density of each physical storage region, the density of the logic storage region.

12. The method of claim 11, wherein determining the number of the consecutive physical storage regions in each logic storage region comprises:
  determining a number of bits of each code among the set of codes of the target bank; and
  determining the number of the physical storage regions in each logic storage region based on a number of the physical storage regions in the target bank and the number of bits of each code.

13. A semiconductor memory, comprising:
  a target bank, comprising at least two storage regions;
  an address processing circuit, configured to output an address of the target bank, wherein an output terminal of the address processing circuit is connected to the target bank;
  a code obtaining circuit, configured to receive a target code, wherein the target code corresponds to at least one storage region to be trimmed in the target bank;
  a region selection signal generation circuit, configured to generate, based on the target code, a region selection signal configured to select the storage region to be trimmed in the target bank, wherein an output terminal of the region selection signal generation circuit is connected to an input terminal of a trim circuit; and
  the trim circuit, configured to trim the storage region to be trimmed based on the region selection signal to configure a density of the target bank, wherein an output terminal of the trim circuit is connected to the target bank.

14. The semiconductor memory of claim 13, further comprising:
  a control circuit, configured to:
    determine the target bank to be configured of the semiconductor memory;
    determine a density configuration parameter of the target bank, wherein the density configuration parameter is configured to represent the density to be configured for the target bank; and
    determine, based on the density configuration parameter of the target bank, the target code from a set of codes of the target bank, wherein the target code corresponds to the storage region to be trimmed in the target bank, wherein an output terminal of the control circuit is connected to the code obtaining circuit.

15. The semiconductor memory of claim 13, wherein the address processing circuit comprises:
  a row address processing circuit, configured to output a row address of the target bank, wherein an output terminal of the row address processing circuit is connected to an input terminal of the region selection signal generation circuit and the target bank;
  a column address processing circuit, configured to output a column address of the target bank, wherein an output terminal of the column address processing circuit is connected to the target bank; and
  a bank address processing circuit, configured to output a bank address of the target bank, wherein an output terminal of the bank address processing circuit is connected to the target bank;
  wherein the region selection signal generation circuit is configured to perform logic processing on the target code and a row address of the storage region to be trimmed corresponding to the target code to obtain a target level, and take the target level as the region selection signal.

16. The semiconductor memory of claim 15, wherein an output terminal of a high-bit address in the row address processing circuit is connected to the input terminal of the region selection signal generation circuit; and
  wherein the high-bit address is configured to distinguish different storage regions in the target bank.

17. The semiconductor memory of claim 15, wherein the region selection signal generation circuit comprises: a logic gate circuit comprising a NAND gate and a NOT gate;
  an input terminal of the logic gate circuit comprise a signal line corresponding to the target code and a signal line corresponding to the row address of the storage region to be trimmed; and
  the logic gate circuit is configured to perform logic processing on the target code and the row address of the storage region to be trimmed corresponding to the target code to obtain the target level, and take the target level as the region selection signal.

18. The semiconductor memory of claim 15, wherein the region selection signal generation circuit comprises a decoder;
  wherein an input terminal of the decoder is a signal line corresponding to the target code; and each level output by the decoder is taken as a region selection signal when the level is valid, and each output terminal of the decoder is connected to the input terminal of the trim circuit.

* * * * *